(12) United States Patent
Cok

(10) Patent No.: US 7,646,146 B2
(45) Date of Patent: *Jan. 12, 2010

(54) OLED DISPLAY WITH PLANAR CONTRAST-ENHANCEMENT ELEMENT

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 437 days.

This patent is subject to a terminal disclaimer.

(21) Appl. No.: 11/512,772

(22) Filed: Aug. 30, 2006

(65) Prior Publication Data

US 2008/0054802 A1 Mar. 6, 2008

(51) Int. Cl.
*H01J 1/62* (2006.01)

(52) U.S. Cl. .................. 313/506; 313/504; 313/512

(58) Field of Classification Search ........... 313/504, 313/512, 506
See application file for complete search history.

(56) References Cited

U.S. PATENT DOCUMENTS

| 4,769,292 | A | 9/1988 | Tang et al. |
| 5,061,569 | A | 10/1991 | VanSlyke et al. |
| 6,226,890 | B1 | 5/2001 | Boroson et al. |
| 6,936,960 | B2 | 8/2005 | Cok |
| 2001/0026124 | A1 | 10/2001 | Liu et al. |
| 2004/0119400 | A1* | 6/2004 | Takahashi et al. ........... 313/504 |
| 2004/0217681 | A1 | 11/2004 | Park |
| 2006/0001341 | A1 | 1/2006 | Jin |
| 2006/0186802 | A1* | 8/2006 | Cok et al. ................... 313/506 |
| 2007/0069635 | A1 | 3/2007 | Cok |

FOREIGN PATENT DOCUMENTS

| JP | 11-265791 | 9/1999 |
| WO | 02/037580 | 5/2002 |
| WO | 2005/059636 | 6/2005 |

OTHER PUBLICATIONS

U.S. Appl. No. 11/065,082, filed Feb. 24, 2005, Cok.
U.S. Appl. No. 11/122,295, filed May 24, 2005, Cok.
U.S. Appl. No. 10/822,517, filed Apr. 12, 2004, Tyan.

* cited by examiner

*Primary Examiner*—Joseph L Williams
(74) *Attorney, Agent, or Firm*—Stephen H. Shaw; Raymond L. Owens

(57) ABSTRACT

An organic light-emitting diode (OLED) device, comprising: a first electrode and a second electrode. One or more organic layers are formed there-between, including an organic light-emitting layer. The second electrode is transparent. A contrast enhancement element is formed on a side of the second electrode, opposite the organic layer, and has a geometric area for controlling ambient light contrast ratio of the OLED device.

9 Claims, 14 Drawing Sheets

OLED DISPLAY WITH PLANAR CONTRAST-ENHANCEMENT ELEMENT

FIELD OF THE INVENTION

The present invention relates to organic light-emitting diode (OLED) devices, and more particularly, to OLED device structures for improving light output and contrast.

BACKGROUND OF THE INVENTION

Organic light-emitting diodes (OLEDs) are a promising technology for flat-panel displays and area illumination lamps and backlights. However, OLED devices typically have a highly reflective back electrode to enhance the output of emitted light through one side of the OLED device. This highly reflective back electrode also reflects ambient light, thereby reducing the ambient contrast ratio of the OLED device. As is known in the prior art, circular polarizers can greatly reduce the reflected ambient light, but such circular polarizers are expensive.

Significant portions of emitted light may also be trapped in OLED devices. Scattering layers may be employed to improve the light emission of OLED devices, but may inhibit the effectiveness of circular polarizers, and do not selectively absorb ambient light. Chou (WO 02/37580, filed 9 Mar. 2001 in the name of 3M Innovative Properties Company) and Liu et al. (U.S. Publication No. 2001/0026124, filed 23 Mar. 2001), e.g., taught the use of a volume or surface scattering layer to improve light extraction. The scattering layer is applied next to the organic layers or on the outside surface of the glass substrate and has optical index that matches these layers. Light emitted from the OLED device at higher than critical angle that would have otherwise been trapped can penetrate into the scattering layer and be scattered out of the device. The light-emitting efficiency of the OLED device is thereby improved, but the ambient contrast is not significantly changed.

One prior-art approach to improving OLED device contrast is to employ a black matrix in all non-emitting areas of an OLED device, as described, for example in U.S. Pat. No. 6,936,960, issued 30 Aug. 2005 to Eastman Kodak Company, by Cok, entitled "OLED Displays Having Improved Contrast". The black matrix absorbs the fraction of ambient light incident upon the device between the light-emitting areas, without absorbing emitted light, thereby improving the contrast of the OLED. Generally, it is preferred to maximize the light-emitting area in an OLED device to reduce the current density in the light-emitting materials and extend the lifetime of the OLED. However, this reduces the amount of area available for a black matrix, thereby increasing the amount of ambient light reflected from the OLED back electrode and reducing the contrast of a top-emitting OLED device.

Other techniques for reducing ambient light reflection include the use of contrast enhancing films. For example, WO 2005/059636, filed 24 Nov. 2004 in the name of Konin-Klijke Philips Electronics N.V., by Kurt, describes a film having a plurality of waveguides separated by interstitial areas formed as narrowing recesses coated with a reflective layer. However, such a design requires small, high-precision features that are expensive to manufacture. Moreover, any imperfection in the reflective layer reduces the absorption of the ambient light and ambient contrast ratio of the device.

There is a need; therefore, for an improved organic light-emitting diode device structure that increases the ambient contrast ratio of an OLED device.

SUMMARY OF THE INVENTION

The present invention is directed to overcoming one or more of the problems set forth above. Briefly summarized, according to one aspect of the present invention, the need is met by an organic light-emitting diode (OLED) device, comprising: a first electrode and a second electrode. One or more organic layers are formed there-between, including an organic light-emitting layer. The second electrode is transparent. A contrast enhancement element is formed on a side of the second electrode, opposite the organic layer, and has a geometric area for controlling ambient light contrast ratio of the OLED device.

Another aspect of the present invention provides a method that increases the ambient contrast ratio of an OLED device. The ambient light contrast ratio within an OLED device, having a first and a second electrode, is increased by forming a contrast enhancement element over either the first or the second electrode. Transparent openings are included for the contrast enhancement element. By adjusting an area corresponding to the transparent openings of the contrast enhancement element the ambient light contrast ratio of the OLED device is increased.

Another aspect of the present invention provides a method for forming a contrast enhancement element to be used with an OLED device. The contrast enhancement element may be formed by providing a transparent film; and forming a reflective layer, having openings, over the transparent film. Next, a light absorbing layer, having openings corresponding to the openings of the reflective layer, is formed. The light absorbing layer is adjacent to the reflective layer.

ADVANTAGES

The present invention has the advantage that it increases the ambient contrast of an OLED device without decreasing the light emission of the OLED device.

It will be understood that the figures are not to scale since the individual layers are too thin and the thickness differences of various layers too great to permit depiction to scale.

DETAILED DESCRIPTION OF THE INVENTION

According to one embodiment of the present invention, an organic light-emitting diode (OLED) device comprises a first electrode and a second electrode having one or more organic layers formed there-between, an organic light-emitting layer, wherein the second electrode is transparent and a contrast enhancement element formed on a side of the second electrode opposite the organic layer and has a geometric area for controlling ambient light contrast ratio of the OLED device. As used herein, a geometric area is a spatial area having a shape and an opening within the spatial area also having a shape. The openings for the contrast enhancement element are transparent in several of the exemplary embodiments disclosed herein. In a typical embodiment, at least one of the electrodes is patterned to form discrete light-emitting areas and the shape of the geometric area corresponds to the shape of the patterned light-emitting area.

In a further embodiment of the present invention, the contrast enhancement element comprises a transparent film having a patterned reflective layer and a corresponding light-absorbing layer formed over the patterned reflective film on the same side of the transparent film, wherein the reflective layer is located between the light absorbing layer and the second transparent electrode and wherein the reflective layer and the light absorbing layer form one or more transparent openings through the reflective and light-absorbing layers so that light emitted by the light-emitting organic layer passes through the transparent openings.

Figure 1:
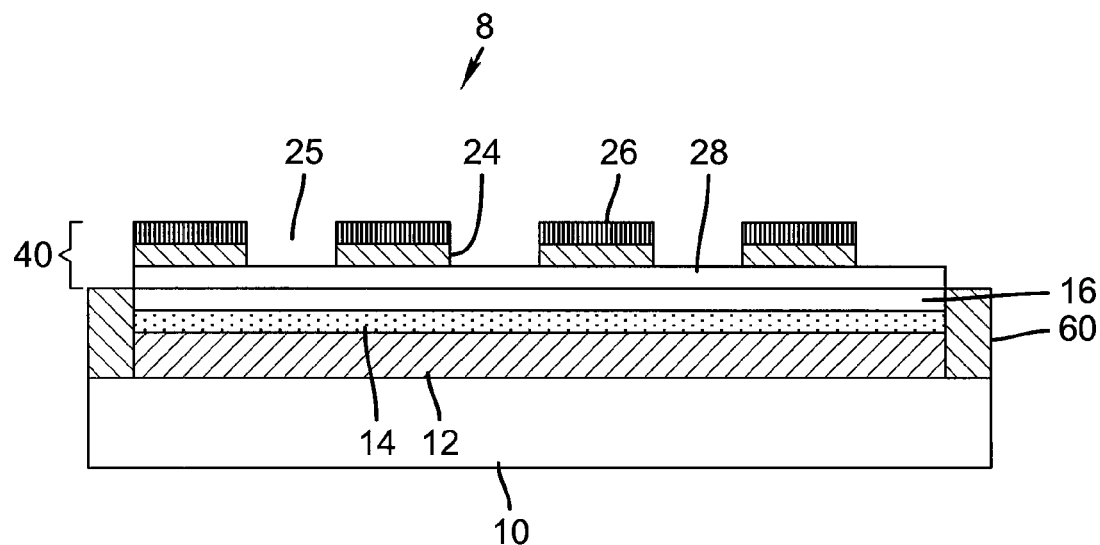
FIG. 1 illustrates a partial cross section of a top-emitter OLED device having a contrast enhancement element according to an embodiment of the present invention.

Referring to FIG. 1, in an embodiment of the present invention, an organic light-emitting diode OLED device 8 comprises a first electrode 12 and a second transparent electrode 16 having one or more organic layers 14 formed there-between, at least one organic layer being light-emitting; and a contrast enhancement element 40 formed on a side of the second transparent electrode 16 opposite the organic layers 14, wherein the contrast enhancement element 40 comprises a transparent film 28 having a patterned reflective layer 24 (e.g., comprising evaporated aluminum or silver) for reflecting emitted light formed on a side of the transparent film 28 (e.g., formed of a polymer such as PET) and a corresponding light-absorbing layer 26 (e.g., comprising carbon black) for absorbing ambient light formed over the patterned reflective layer 24 on the same side of the transparent film 28, wherein the reflective layer 24 is located between the light absorbing 26 layer and the second transparent electrode 16 and wherein the corresponding layers form one or more transparent openings 25 through the reflective and light-absorbing layers 24 and 26 so that light emitted by the light-emitting organic layers 14 passes through the transparent openings 25. Due to the presence of the patterned reflective layer 24 and corresponding light-absorbing layer 26, openings 25 through contrast enhancement element 40 are relatively transparent compared to non-opening areas of element 40, so as to preferentially pass light through such openings. Reflective edges 60 may be employed to prevent light escaping from the light-emitting area defined by the electrodes. In the top-emitting embodiment of FIG. 1, the OLED electrodes 12 and 16 and organic layers 14 are located between a substrate 10 and the contrast enhancement element 40. First electrode 12 is preferably a reflective electrode, to optimize emitted light output through transparent second electrode 16. The contrast enhancement film 40 may have portions with no reflective area corresponding to portions of the OLED device 8 that are not light-emitting. Such non-light-emitting areas are found between the patterned light-emitting pixels.

Figure 8A:
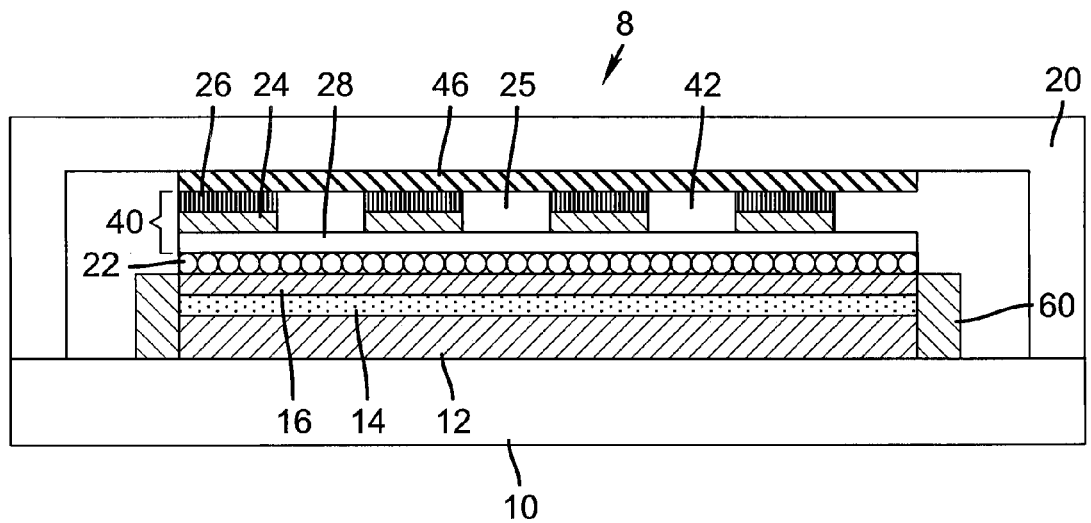
FIGS. 8a and 8b illustrates the use of a color filter layer in combination with the partial cross section of the top-emitter OLED device of FIG. 2 in alternative embodiments of the present invention.
Figure 8B:
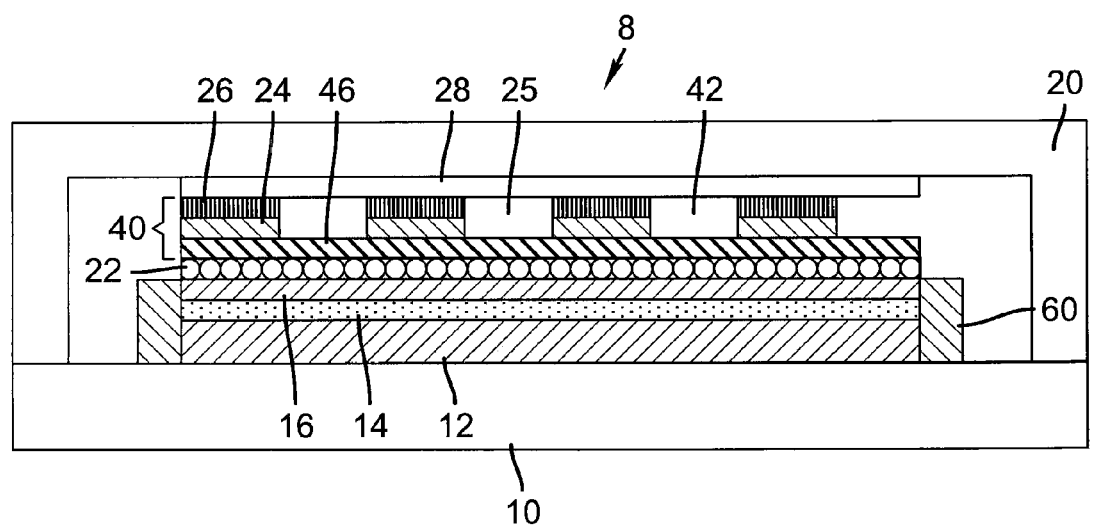

Although the contrast enhancement layer 40 is shown with the transparent film 28 adjacent to the reflective layer 24, in an alternative embodiment of the present invention, the transparent film 28 may be adjacent to the light absorbing layer 26 (as shown in FIG. 8b) so long as the reflective layer 24 is located between the light absorbing 26 layer and the second transparent electrode 16. The contrast enhancement layer 40 may be separately formed and later combined with the OLED electrodes and materials.

Figure 2:
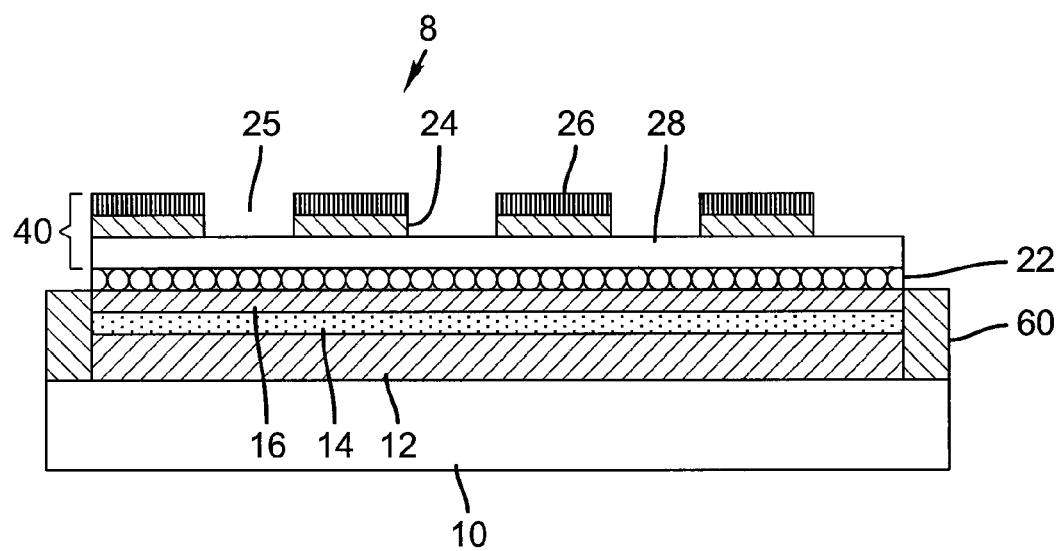
FIG. 2 illustrates a partial cross section of a top-emitter OLED device having a contrast enhancement element and an adjacent scattering layer according to another embodiment of the present invention.
Figure 3:
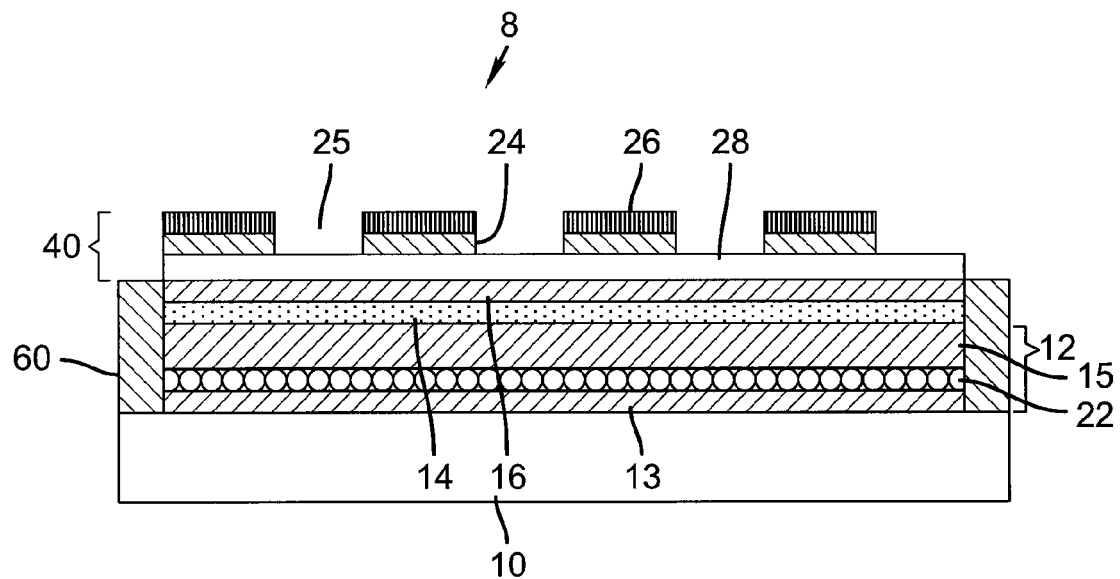
FIG. 3 illustrates a partial cross section of a top-emitter OLED device having a contrast enhancement element located opposite a scattering layer according to an alternative embodiment of the present invention.

Referring to FIG. 2, in another top-emitter embodiment of the present invention, a scattering layer 22 is employed to increase the light output of the OLED device 8. As described in co-pending, commonly assigned U.S. Ser. No. 11/065,082 (Docket 89211), filed Feb. 24, 2005, the disclosure of which is hereby incorporated by reference, light emitted by the organic layers of an OLED may be trapped within the OLED device 8 and a scattering layer may be employed to scatter the trapped light out of the OLED device 8. In the embodiments of FIG. 2, the scattering layer 22 is located between the second transparent electrode 16 and the contrast enhancement element 40. In an alternative top-emitter embodiment shown in FIG. 3, the electrodes and the organic layers may be located between the contrast enhancement element 40 and the scattering layer 22. In this embodiment, the first electrode 12 comprises multiple layers including a transparent layer and a reflective layer. As shown in FIG. 3, the scattering layer 22 is provided between a transparent electrode 15 and a reflective layer 13 to scatter and reflect light emitted by the organic layers. In various other embodiments, the reflective layer 15 may itself comprise a scattering surface.

Figure 4:
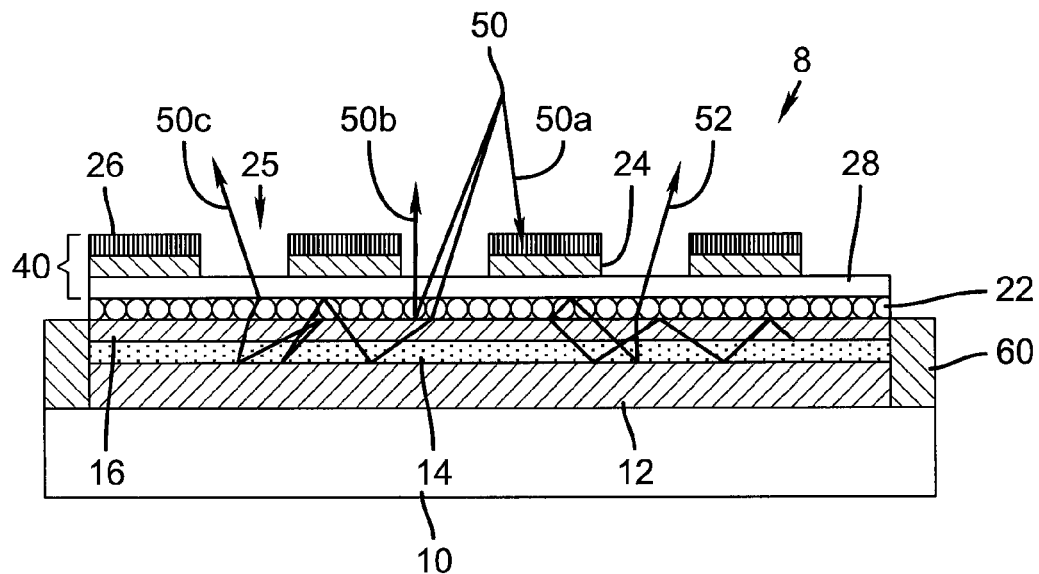
FIG. 4 illustrates light rays traveling through a partial cross section of the top-emitter OLED device of FIG. 2.

Referring to FIG. 4, in operation light 52 emitted by the organic layers 14 may be emitted from the OLED device 8 through the relatively transparent openings 25 in the contrast enhancement element 40. Light that is not emitted toward an opening 25 will be reflected from the reflective portion 24 of the contrast enhancement element 40 and a reflective first electrode 12 until the light is emitted through a transparent opening 25 and is transmitted out of the OLED device 8. If a scattering layer 22 is employed (as shown), the light rays' directions will be altered each time a light ray encounters the scattering layer 22 until the light ray passes through an opening. It is possible that a light ray 52 may reflect between the scattering layer 22 and the reflective portion 24 without encountering first electrode 12. Applicants have determined that the organic layers of the OLED may be light absorbing.

Hence, it is preferred that any reflected light not travel through the organic layers and reflect from the first electrode. The use of a scattering layer between the contrast enhancement element and the second electrode can reflect a portion of the light reflected from the reflective layer 24 back toward the contrast enhancement layer whence it may pass out of the device.

Ambient light 50 that is incident on the contrast enhancement element 40 will either be absorbed 50a by the light-absorbing portion 26 of the contrast enhancement element 40 or pass into the OLED and encounter the scattering layer 22 (if present) and/or the first electrode 12. The light 50b and 50c that passes into the OLED will eventually be reflected back out in a similar manner to the emitted light layer and will reduce the contrast of the OLED device 8. However, by decreasing the relative area of the openings 25 with respect to the total area of the contrast enhancement element 40, the contrast of the OLED device 8 can be increased. The physical limit of the contrast improvement possible by employing the contrast enhancement element 40 according to the present invention will then be limited by the actual absorption of light in the material layers 14 in the OLED and by losses due to imperfect reflection by a reflective first electrode 12 or the reflective portions 24 of the contrast enhancement element 40. These absorption and imperfect reflections will also reduce the amount of emitted light that passes out of the OLED device. According to the present invention, the light-absorbing layer 26 or surface will improve the ambient contrast of the OLED device in direct ratio to the light-absorbing percentage of the area of the contrast enhancement element 40.

Figure 5:
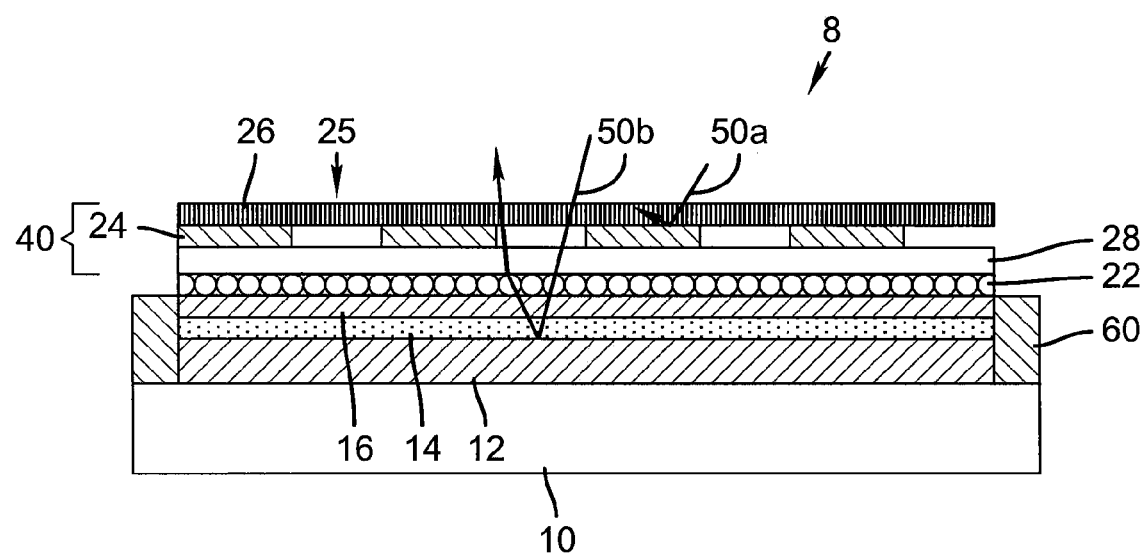
FIG. 5 illustrates a partial cross section of a top-emitter OLED device having a contrast enhancement element comprising a circular polarizer according to yet another embodiment of the present invention.

While a non-polarizing-dependent light-absorbing material may preferably be employed for layer 26 in a pattern corresponding to that of patterned reflective layer 24 (such as a black matrix employing carbon black), an unpatterned circular polarizer may also be employed as the corresponding light-absorbing layer 26 to relatively and selectively absorb ambient light when used in combination with a patterned reflective layer 24 having a polarizing-preserving reflective surface. Referring to FIG. 5, light-absorbing layer 26 is a circular polarizer (either patterned or unpatterned) located over patterned reflective layer 24. Some ambient light 50a is first polarized, and then reflected from layer 24 and effectively absorbed (e.g., 99% absorbed) in layer 26. Ambient light passing a first time through the transparent openings will also be polarized, but such polarization will be disturbed by scattering layer 22 such that reflected ambient light will not be totally absorbed upon passing through the openings 25 a second time. Such reflected ambient light may be repolarized, however, thereby further absorbing the ambient light. Emitted light will also pass through the transparent openings 25. As such emitted light will only pass through openings 25 once, however, only approximately half of such light will be absorbed, and the circular polarizer in combination with a patterned reflective layer thus effectively and selectively absorbs ambient light so that ambient contrast may be improved. In a further alternative embodiment, layer 26 may comprise a patterned circular polarizer.

In any practical implementation of a useful OLED device, there should be at least one opening in the contrast enhancement element for each light emitting area, although multiple openings may be preferred. Hence, the minimum number of openings and the maximum spacing of the openings are limited by the OLED device. In general, it is useful to have several transparent openings 25 per light-emitting area or pixel. For example, an OLED device might have a plurality of light-emitting areas defined by a patterned electrode of 50 microns by 200 microns and separated by a 20-micron gap. In such case, the contrast enhancement element preferably will have transparent openings 25 that are centered apart by at most 50 microns in one dimension and 200 microns in a second dimension and preferably less than half that to avoid the transparent openings 25 falling between the light-emitting areas. Hence, the first or second electrode may be patterned to form multiple light-emitting areas, each light-emitting area having first and second distances in at least two dimensions and wherein the one or more transparent openings in the contrast enhancement element are spaced apart by a distance equal to or smaller than the distance in each dimension. The size and shape of the openings are not critical and may be determined by practical limitations in the manufacture of the contrast enhancement element. However, the size of the opening will directly affect the ambient contrast ratio of the device. Since light may be absorbed by the organic layers 14 or imperfectly reflected from a reflective first electrode 12 or reflective portion of layer 24, it is preferred that many openings be provided for each light-emitting area. For example, it may be preferred to provide 10 micron-diameter openings on 20-micron centers to provide an approximately 80% black-matrix fill factor. Alternatively, it may be preferred to provide 6 micron-diameter openings on 12-micron centers to provide a similar black-matrix fill factor. The more frequently spaced openings may decrease emitted light absorption. Applicants herein have constructed a contrast enhancement element with an approximately 80% black matrix fill factor that demonstrated an improved ambient contrast ratio when used with an OLED device.

The reflective and light-absorbing layers 24 and 26 may be formed in, or on, transparent film 28 with patterned transparent and light-absorbing coatings on either side or surface of the film and holes or transparent areas in the film providing the openings. Suitable film materials are known in the art, for example polyethylene teraphthalate (PET). If the contrast enhancement element 40 has sufficient transparent openings 25, the transparent film 28 need not be aligned to the OLED device 8. The contrast enhancement element 40 may be in contact with both the cover and the top layer of the OLED device 8. In this way, a readily manufacturable solid-state structure having excellent mechanical stability may be formed.

As noted above, light emitted by the light-emitting organic layer may be trapped in the high-index organic and electrode layers 14 and 16. By employing a high-index material having an optical index equal to or greater than that of the light-emitting organic layer 14, light emitted from the light-emitting organic layer 14 will travel into the transparent film 28 and passes through the transparent openings 25, thus escaping from the OLED device 8 without requiring the use of a scattering layer. Furthermore, no light is trapped between the organic layer 14 and the contrast enhancement film 40.

Figure 6A:
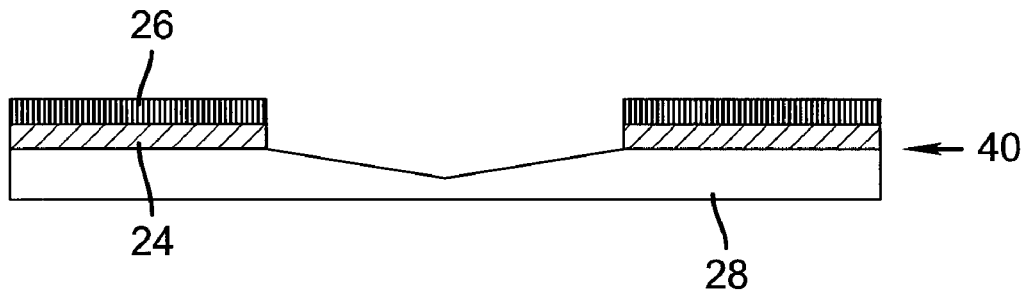
FIGS. 6a-c are side views of various embodiments of contrast enhancement elements according to alternative embodiments of the present invention.
Figure 6B:
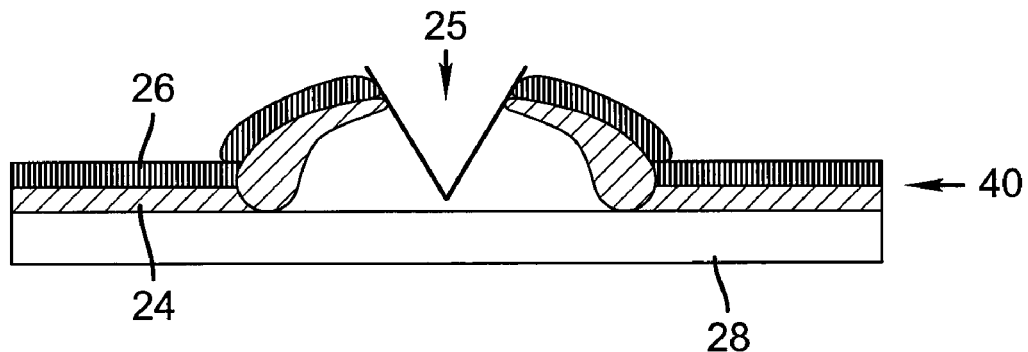
Figure 6C:
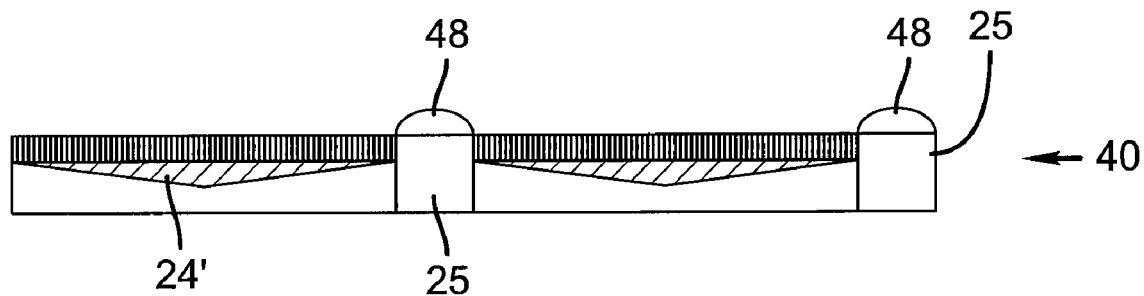

To enhance the performance of the contrast enhancement element, it may be possible to structure the reflective portions 24 or the transparent openings 25. The reflective layer 24 may form a planar reflective surface, an angled segmented reflective surface, or a curved reflective surface. Alternatively, referring to FIG. 6a, the transparent film 28 may be structured to enhance the light output from light traveling in the transparent film 28. The transparent film 28 may include structures having depressions or projections, for example cones, pyramids, hemispheres, or tetrahedrons, or portions of such structures, cut into the film surface (as shown in FIG. 6a). Alternatively as shown in FIG. 6b, additional material may be provided on the surface of transparent film 28 to construct depressions or projections such as cones, pyramids, hemispheres, ellipsoids, or tetrahedrons or portions of such structures. Referring to FIG. 6c, the structured surface on the transparent film 28 may also form a structured reflector 24' and/or the additional materials may form, for example, lenslets 48 or axicons that may improve the light output or contrast of the contrast enhancement film 40.

Figure 7:
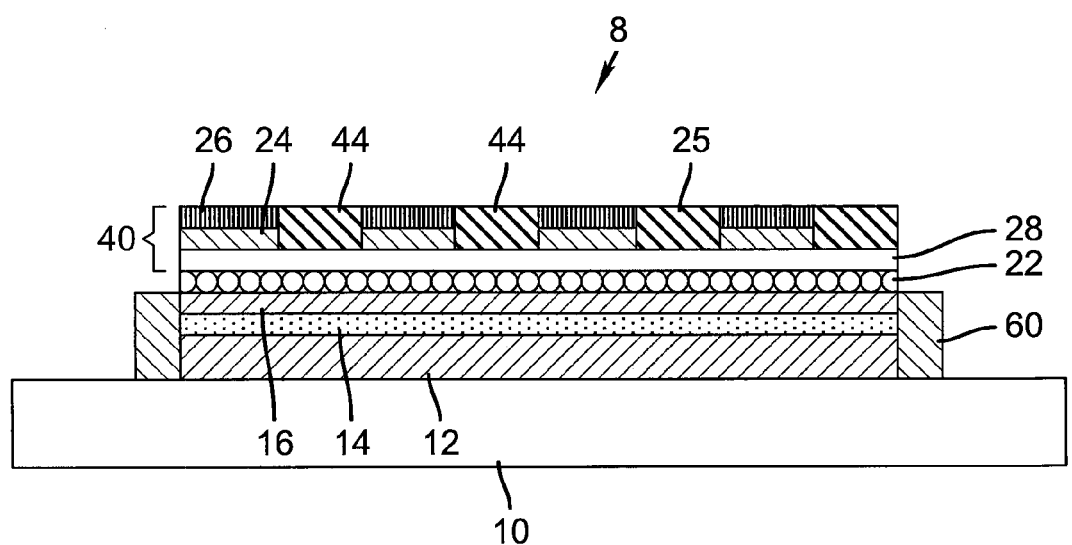
FIG. 7 illustrates the use of individual color filters in combination with the partial cross section of the top-emitter OLED device of FIG. 2 as an alternative embodiment of the present invention.

Referring to FIG. 7, in further embodiments of the present invention, a color filter 44 may be located in the former location of the transparent opening 25 to filter the light output from the OLED device 8. The OLED organic layers 14 may either emit a colored light or a broadband (primarily white) light and the color filter may be employed to provide an appropriate color of light, for example to provide a full-color OLED display. In various embodiments, the color filter 44 may be located on the OLED above or below the scattering layer, in or on the contrast enhancement element 40, or formed on the cover or substrate of a top-emitting or bottom-emitting OLED device, respectively. Color filters are known in the art and may include, for example, pigments or dyes formed in or on a base material, for example film or various protective layers such as glass, silicon or silicon-based materials, polymers, or metal oxides. The color filters may be formed in a layer and a variety of colors provided in different locations in the layer.

Alternatively, referring to FIG. 8, a color filter layer 46 may be located over the entire extent of the OLED light-emitting area under the contrast enhancement element 40. The color filter layer 46 may be formed over the contrast enhancement layer 40 (as shown in FIG. 8a), or on a transparent electrode or any protective or encapsulating layers formed on a transparent electrode or formed on the cover or substrate of a top-emitting or bottom-emitting OLED device, respectively (as shown in FIG. 8b). The color filter layer 46 may be located between the scattering layer 22 and the contrast enhancement element 40. In this case, both emitted and ambient light that is reflected within the OLED device may pass through the filter multiple times.

A transparent low-index element (possibly an air gap) having a refractive index lower than the refractive index of an encapsulating cover or substrate through which light is emitted from the OLED device and lower than the refractive index range of the OLED element materials may be employed between the transparent electrode 16 and the substrate or cover in combination with a scattering layer to improve the sharpness of the OLED device, as is disclosed in co-pending, commonly assigned U.S. Ser. No. 11/065,082, filed Feb. 24, 2005, the disclosure of which is hereby incorporated by reference. In accordance with the present invention, such a low-index layer may be incorporated into the contrast enhancement element 40. The openings in the contrast enhancement element 40, e.g., may form a low-index element having a refractive index lower than the refractive index range of the organic layers and of the substrate or cover through which light is emitted. In this embodiment, the low-index element is between the scattering layer and the substrate or cover through which light is emitted.

Figure 9A:
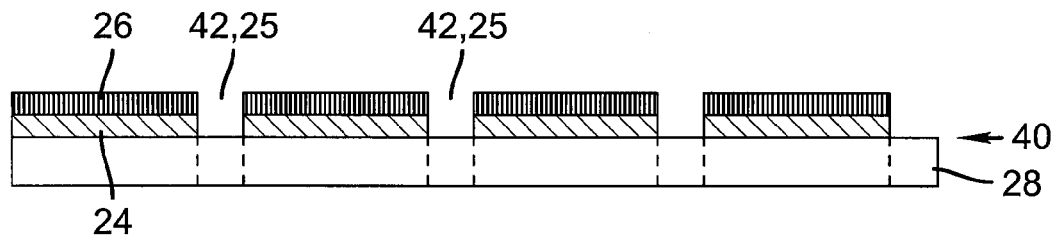
FIGS. 9a-9c are side views of various embodiments of a contrast enhancement film having a low-index element according to alternative embodiments of the present invention.
Figure 9B:
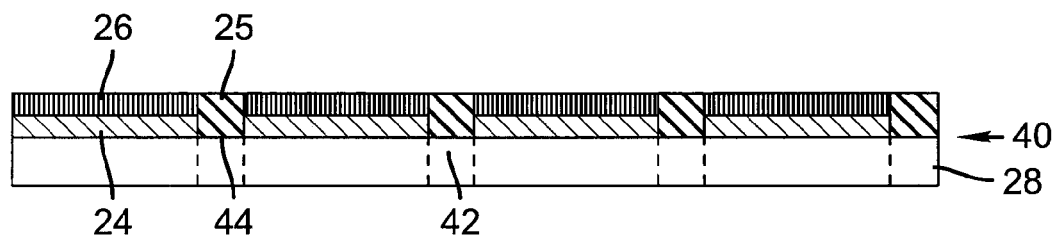
Figure 9C:
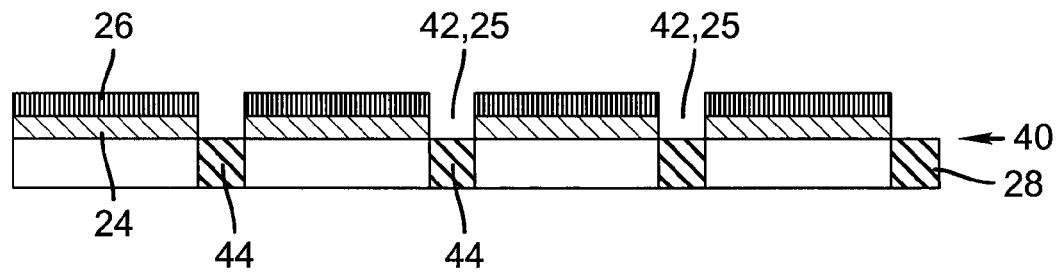

If the opening in the contrast enhancement element 40 is not a transparent polymer or glass, for example, but is filled with a gas or vacuum, the gas or vacuum will provide a low-index layer useful in preserving the sharpness of a multi-pixel OLED device 8. Hence, a transparent opening 25 in the contrast enhancement film 40 may serve as a low-index layer. Referring to FIG. 9a, a contrast enhancement element 40 may comprise a transparent film 28 with openings 25 between which are formed reflective layers 24 on one side of the transparent film 28 and light-absorbing layers 26 on the other side of the film. In the embodiments of FIG. 9a, the openings 25 are actually physical holes in the film 28 (shown by dotted lines) where there is an absence of solid material. The holes may be filled with air or an inert gas, such as nitrogen or argon, to form a low-index layer 42. In alternative embodiments, the transparent openings 25 may comprise transparent portions of the transparent film 28. In such embodiment, openings in the layers 24 and/or 26 may themselves be sufficient to provide a low-index gap. Referring to FIG. 9b, the otherwise transparent openings 25 may be partially or completely filled with a color filter 44. (If the openings 25 are completely filled, they may not provide a low-index layer 42.) Alternatively, referring to FIG. 9c, the bottom side only of openings 25 may be filled with a color filter 44.

Since the low-index element has an optical index lower than that of the OLED elements and the cover or substrate through which light is emitted, any light that is scattered into the low-index layer 42 by the scattering layer 22 shown earlier in FIG. 5 will pass through the layer and the cover or substrate, since light passing from a low-index material (the layer 42) into a higher index material (the cover or substrate) cannot experience total internal reflection.

Figure 13A:
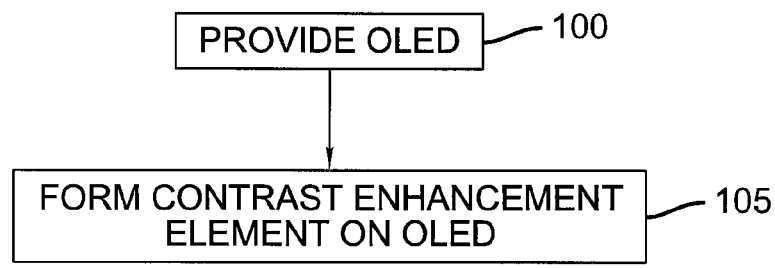
FIGS. 13a and 13b illustrate different methods of making an OLED according to various embodiments of the present invention.
Figure 13B:
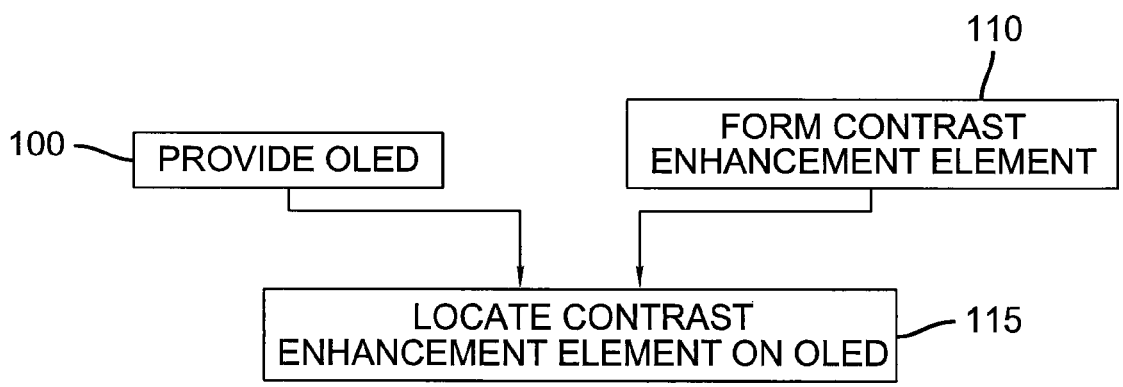

Referring to FIG. 13a, according to a method of the present invention, the ambient light contrast ratio within an OLED device may be increased by several operational steps, include step 100 that provides the OLED device having a first and a second electrode and subsequent step 105 that forms a contrast enhancement element over either the first or the second electrode. Transparent openings are included for the contrast enhancement element. By adjusting an area corresponding to the transparent openings of the contrast enhancement element the ambient light contrast ratio of the OLED device is increased. In an alternative embodiment of the present invention shown in FIG. 13b, the OLED device may be provided in step 100, and the contrast enhancement element formed in step 110 separately from each other. The contrast enhancement element subsequently located during step 115 on the OLED.

Figure 14A:
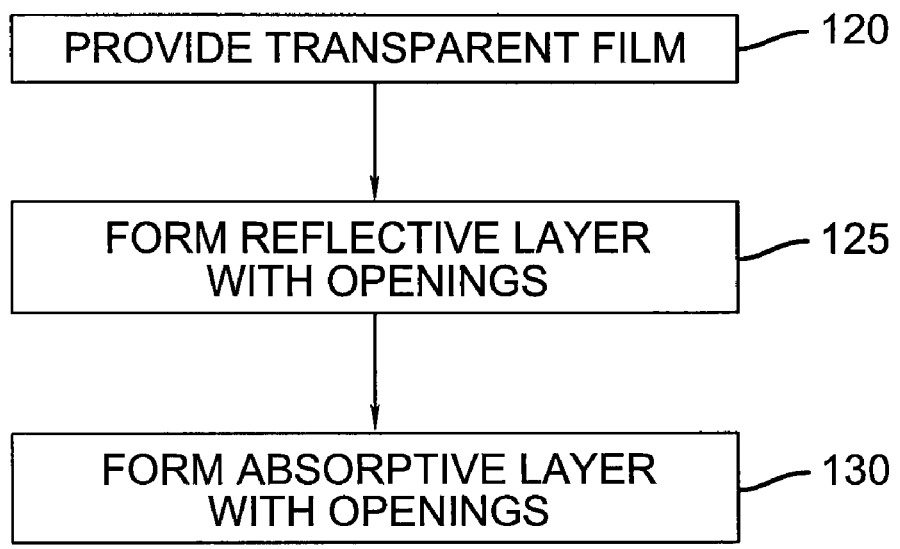
FIGS. 14a, 14b, and 14c illustrate different methods of making a contrast enhancement element according to various embodiments of the present invention.
Figure 14B:
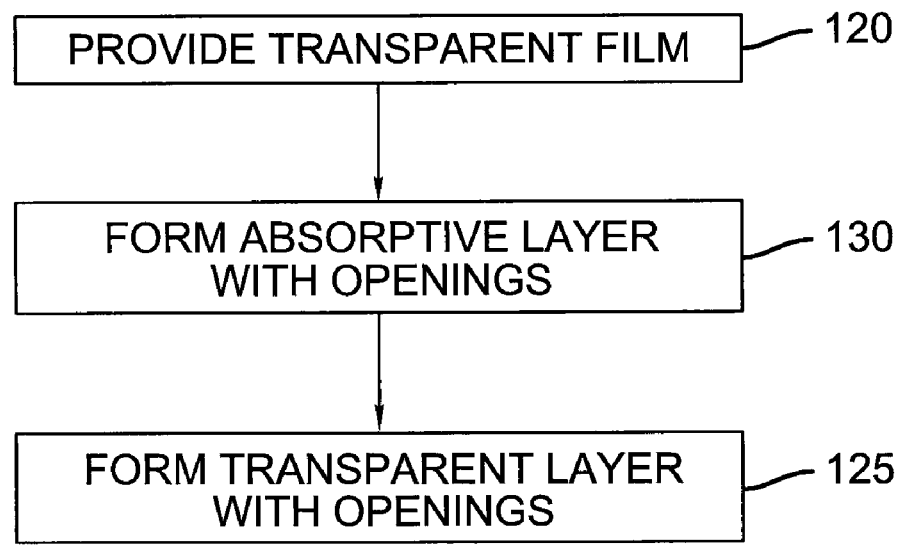
Figure 14C:
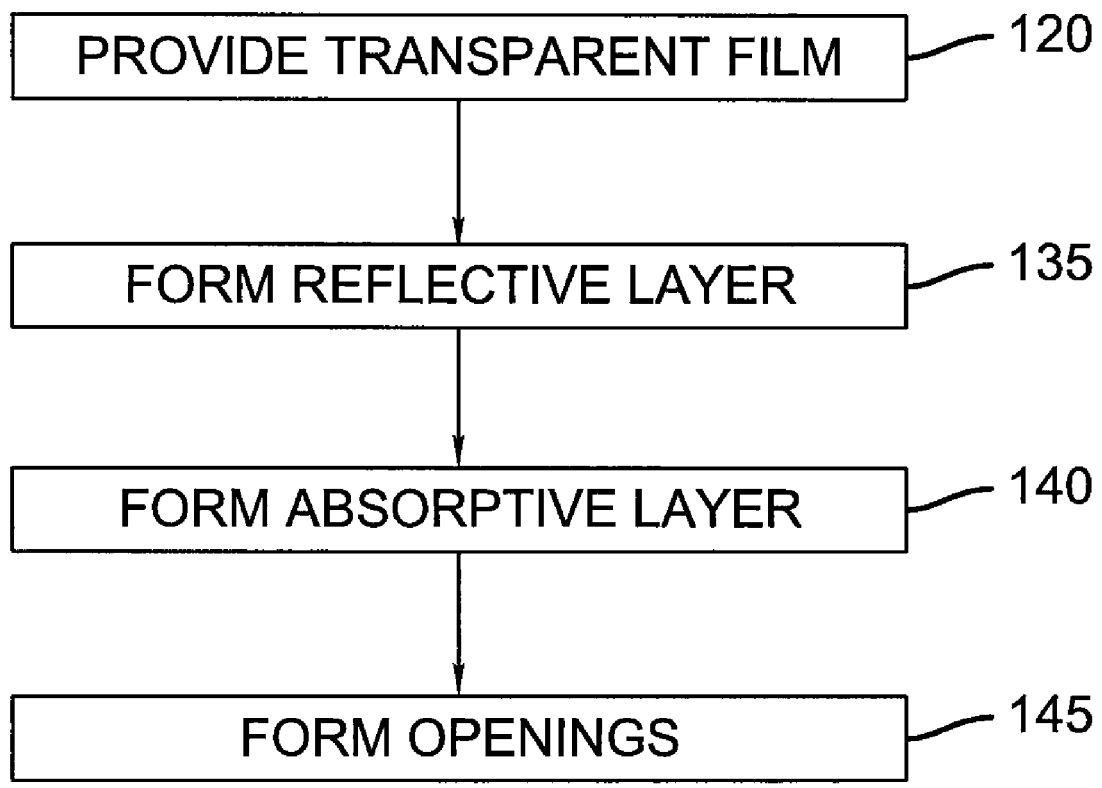

Referring to FIG. 14a, the contrast enhancement element maybe formed in step 120 by providing a transparent film; and step 125 forms a reflective layer, having openings, over the transparent film. Next, a light absorbing layer, having openings corresponding to the openings of the reflective layer, is formed in step 130. The light absorbing layer is adjacent to the reflective layer. Alternatively, if the contrast enhancement element is oriented in a reverse direction, the absorptive layer and the reflective layer may be formed in the reverse order, as shown by steps 130 and 125 respectively in FIG. 14b. Step 120 that provides the transparent film remains as the initial step. In yet another embodiment illustrated in FIG. 14c, also having step 120 as the initial step of providing the transparent film, the reflective layer and absorptive layer may be formed without openings (steps 135 and 140 respectively) and openings subsequently formed in step 145 in both layers and, optionally, the transparent film using photolithographic or mechanical techniques.

Figure 10A:
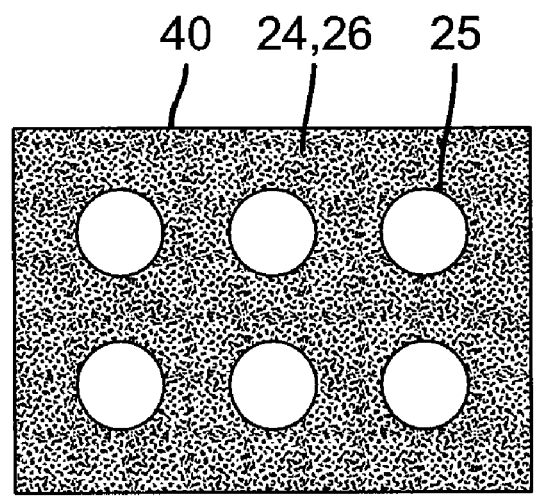
FIGS. 10a-d are top views of various embodiments of a contrast enhancement element according to alternative embodiments of the present invention.
Figure 10B:
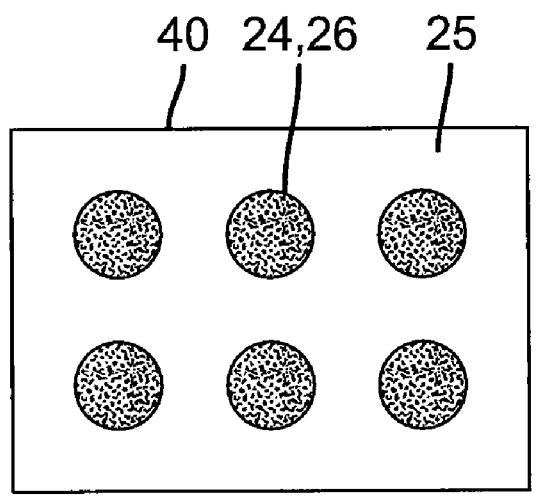

Referring to FIGS. 10a-d, the patterning of a contrast enhancement element 40 according to various embodiments of the present invention is shown. In FIG. 10a, an array of circular holes forming transparent openings 25 are formed in a film having a reflective layer 24 on one side and a light-absorbing layer 26 on the other side. Alternatively, as shown in FIG. 10b, layers 24 and 26 may be formed as circular islands surrounded by transparent opening 25. In the embodiment of FIG. 10a, the contrast enhancement element 40 may readily be formed from a film with holes while in FIG. 10b the film may include transparent openings but not physical holes to provide physical support to the reflective and light-absorbing layers. Alternatively, the reflective and light-absorbing layers may not be formed in a film but constructed, for example, using photolithography.

Figure 10C:
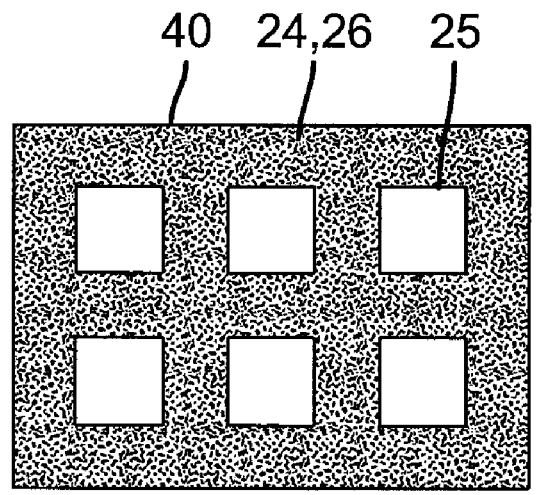
Figure 10D:
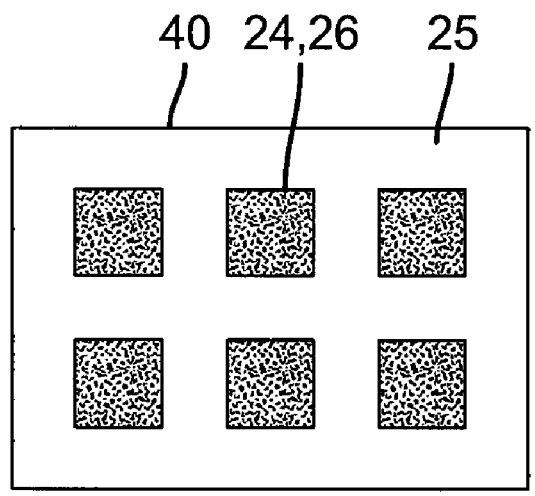

A wide variety of shapes may be employed in various embodiments of the present inventions, for example as shown in FIGS. 10c and 10d, rectangular areas may be employed rather than circular areas.

Figure 11A:
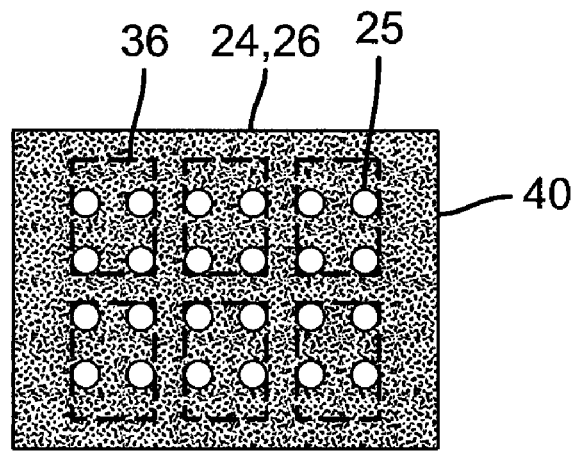
FIGS. 11a-c are top views of various embodiments of a contrast enhancement element over multiple, separate light-emissive areas according to alternative embodiments of the present invention.
Figure 11B:
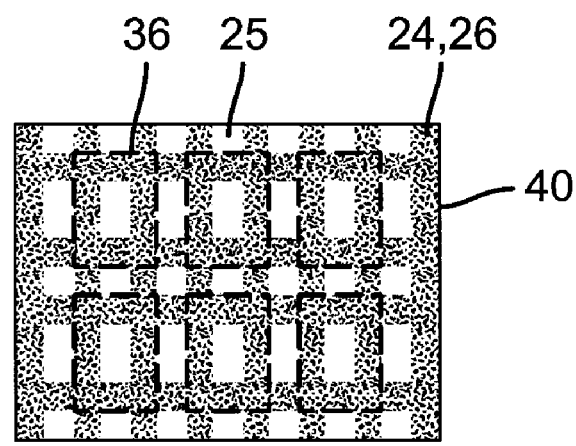
Figure 11C:
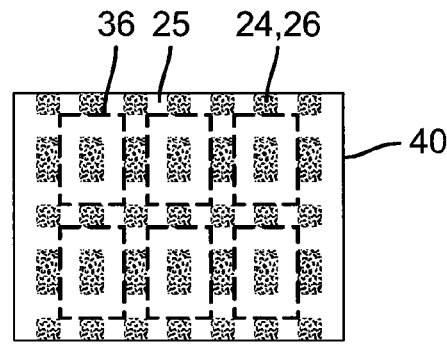

Referring to FIGS. 11a and b, at least one but preferably a plurality of transparent openings 25 are located over light-emitting areas 36 of an OLED device. As noted with respect to FIGS. 10a-d and illustrated in FIGS. 11a-c, a wide variety of shapes, layout, and relative sizes may be employed. In FIG. 11a, circular transparent openings 25 are surrounded by aligned reflective and light-absorbing layers 24 and 26 and located over light-emissive areas 36. In FIG. 11b, rectangular transparent openings 25 are surrounded by aligned reflective and light-absorbing layers 24 and 26 located at the periphery of light-emissive areas 36. A single central transparent opening 25 is then formed at the center of the light-emitting area 36. While additional openings are depicted between light-emissive areas, such additional openings may or may not be employed in various embodiments. FIG. 11c is the reverse of FIG. 11b, in which the aligned reflective and light-absorbing layers 24 and 26 are located at the center of the light-emissive area 36.

When employed, the scattering layer 22 should be optically integrated with the light emitters in order to effectively enhance the light output of the OLED device. The term 'optically integrated' means that there are no intervening layers having an optical index lower than the optical index of any of the organic and transparent electrode layers, and that light that passes through any one of the layers will encounter the scattering layer. The one or more organic layers may include one or more of the following layers: a hole-injection layer, hole-transport layer, electron-injection layer, electron-transport layer, and a light-emitting layer. More than one light-emitting layer may be employed in the present invention, for example to create a white light output. These layers are well known in the OLED art. Although OLED layer structures are more typically described with a cathode on the top and an anode on the bottom near the substrate, it is well known that the organic layers can be inverted and the positions of the anode and cathode exchanged. Such inverted structures are included in the present invention.

In preferred embodiments, the contrast enhancement element is partially, largely, or completely co-extensive with either the first or second transparent electrodes to maximize the contrast and light output of the OLED device.

Various conductive and scattering materials useful in the present invention, as well as the employment of scattering layers for extracting additional light from the device are described in more detail in co-pending, commonly assigned U.S. Ser. No. 11/065,082, filed in the name of Eastman Kodak Company on Feb. 24, 2005, by Cok et al., the disclosure of which is incorporated by reference above. Additional layers may be usefully employed with the present invention. For example, one problem that may be encountered with scattering layers is that the organics may not prevent the electrodes from shorting near the sharp edges associated with the scattering elements in the layer 22. Although the scattering layer may be planarized, typically such planarizing operations do not form a perfectly smooth, defect-free surface. To reduce the possibility of shorts between the electrodes, a short-reduction layer (not shown) may be employed between an electrode and the organic layers, when the electrode is formed over the scattering layer. Such a layer is a thin layer of high-resistance material (for example having a through-thickness resistivity between $10^{-7}$ ohm-$cm^2$ to $10^3$ ohm-$cm^2$). Because the short-reduction layer is very thin, device current can pass between the electrodes through the device layers but leakage current through the shorts are much reduced. Such layers are described in co-pending, commonly assigned U.S. Ser. No. 10/822,517, filed Apr. 12, 2004, in the name of Eastman Kodak Company by Tyan et al., the disclosure of which is incorporated herein by reference.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation. Atomic layer deposition may be employed to provide encapsulation, for example as described in copending, commonly assigned U.S. Ser. No. 11/122,295, filed Apr. 5, 2005, in the name of Eastman Kodak Company by Cok et al., the disclosure of which is incorporated by reference herein. These encapsulation layers may be formed over the transparent electrode either under or over any of the scattering layers, color filter layers, or contrast enhancement elements.

Figure 12:
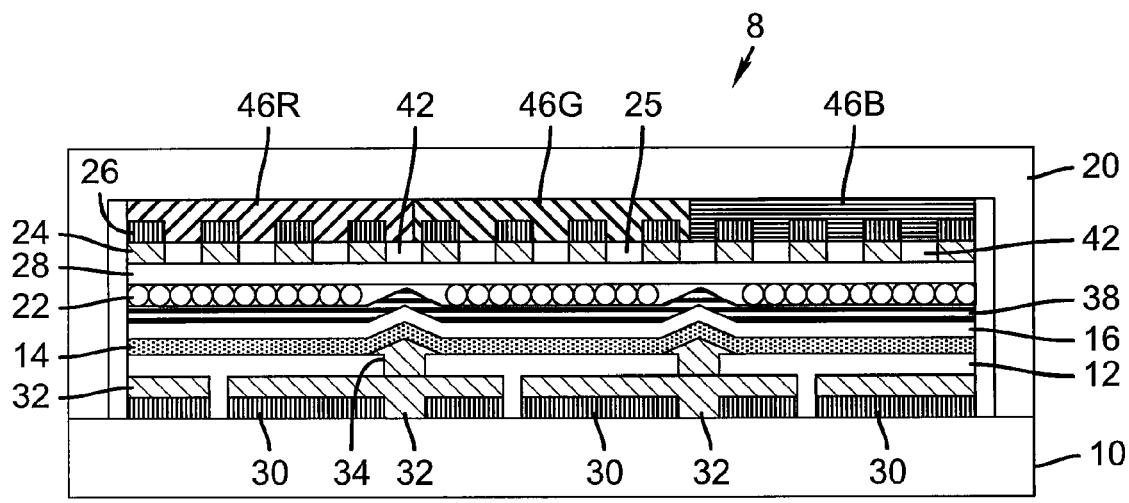
FIG. 12 illustrates a color-pixilated active-matrix OLED device according to an embodiment of the present invention.

The present invention is useful in improving the performance of an active-matrix OLED device employing patterned electrodes to control light emission from a plurality of light-emitting pixel areas. Referring to FIG. 12, a top-emitting pixilated OLED device 8 according to an embodiment of the present invention is illustrated having a substrate 10 (either reflective, transparent, or opaque). Over the substrate 10, a semi-conducting layer is formed providing thin-film electronic components 30 for driving an OLED. An interlayer insulating and planarizing layer 32 is formed over and between the thin-film electronic components 30 and a first patterned reflective metal electrode 12 defining OLED light-emissive pixels is formed over the insulating layer 32. Such metal electrodes 12 are typically formed by evaporating or sputtering metal in a photolithographic process. An inter-pixel insulating film 34 separates the elements of the patterned reflective metal electrode 12. One or more first layers 14 of organic materials described above, one or more of which together emits broadband light, are formed over the patterned reflective metal electrode 12. Such organic layers 14 are typically formed by evaporation through a mask. A transparent second electrode 16 (typically formed by sputtering) is formed over the one or more first layers 14 of organic material. The first reflective electrode 12 may instead be at least partially transparent and/or light absorbing. Typically, the reflective metal electrode 12 comprises Al, Ag, Mg, or alloys of these or other reflective metals. The transparent electrode 16 may comprise ITO or other transparent and conductive metal oxides.

A protective layer 38, for example comprising aluminum oxide and/or parylene, is formed over the transparent electrode 16, for example by atomic deposition and/or spray coating. A scattering layer 22 is formed over the protective layer 38, for example by spray coating. A contrast enhancement 42 element formed separately and having a plurality of holes 25 located through transparent film 28 on center spacing smaller than the size of the pixel defined by patterned electrodes 12 is coated on one side by a reflective layer 24 of material, for example evaporated aluminum and a light-absorbing layer 26 comprising, for example carbon black. A patterned layer of color filters 46R, 46G, and 46B (for example red, green, and blue) is formed over and between the light-absorbing layer 26. The separately formed contrast enhancement element 42 formed in a transparent film 28 is then aligned with the patterned electrodes 12 and affixed to the OLED over the scattering layer 22. A cover 20 may be placed over and in contact with the contrast enhancement film or an additional gap (possibly a low-index gap) may be located between the transparent film 28 of the contrast enhancement element 40 and the inside surface of the cover 20. The color filters 46 may alternatively be located on the cover 20, so that the transparent film 28 of contrast enhancement element 40 does not need to be aligned with the patterned electrodes 12 (but the cover 20 is subsequently aligned).

The present invention may also be employed with four-sub-pixel display designs for example, having a red, green, blue, and white emitter. A neutral density filter may be located over any of the emitters, but in particular may be employed with a white emitter to improve device contrast. Such color or neutral density filters may be located in any of the locations taught herein. In various embodiments, the organic layers may emit color light so that the color filters are unnecessary. The color filters 46R, 46G, 46B, 46W may be located above or below the cover 20, the contrast enhancement element 40, or the scattering layer 22.

OLED devices of this invention can employ various well-known optical effects in order to enhance their properties if desired. This includes optimizing layer thicknesses to yield maximum light transmission, providing dielectric mirror structures, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over or as part of the cover or substrate.

The present invention may be practiced with either active- or passive-matrix OLED devices, and is particularly useful in display devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST

8 OLED device
10 substrate
12 reflective electrode
13 reflective layer
14 organic layer(s)
15 transparent electrode
16 transparent electrode
20 cover
22 scattering layer
24, 24', 24" reflective layer
25 transparent openings
26 light-absorbing layer
28 transparent film
30 thin-film circuitry
32 insulator
34 insulator
36 light-emissive area
38 protective layer
40 contrast enhancement element
42 transparent low-index element
44 color filter
46 color filter
46R, 46G, 46B, 46W color filters
48 lenslet
50, 50a, 50b, 50c ambient light rays
52 emitted light ray
60 reflective edge
100 provide OLED step
105 form contrast enhancement element on OLED step
110 form contrast enhancement element step
115 locate contrast enhancement element on OLED step
120 provide transparent film step
125 form reflective layer with openings step
130 form absorptive layer with openings step
135 form reflective layer step
140 form absorptive layer step
145 form openings step

The invention claimed is:

1. An organic light-emitting diode (OLED) device, comprising:
   a substrate and a cover located over the substrate through which light is emitted;
   a first reflective electrode formed over the substrate, one or more organic light-emitting layers formed over the first reflective electrode, a second transparent electrode formed over the one or more organic light-emitting layers;
   a contrast enhancement element having a planar transparent film with a planar light-absorbing layer and a planar light-reflecting layer and wherein the planar transparent film is located on a side of the second transparent electrode opposite the organic layer and has a geometric area for controlling ambient light contrast ratio of the OLED device; and
   wherein the planar transparent film has a patterned planar light-reflecting layer and a corresponding planar light-absorbing layer formed over the patterned planar light-reflecting layer on the same side of the planar transparent film, wherein the patterned planar light-reflecting layer is located between the planar light-absorbing layer and the second transparent electrode and wherein the patterned planar light-reflecting layer and the planar light-absorbing layer define one or more transparent openings though the patterned planar light-emitting organic layer passes through the transparent openings of the planar transparent film; and
   a scattering layer, wherein the one or more transparent openings in the contrast enhancement element form a low-index element having a refractive index lower than the refractive index range of the organic layers and of the cover, and wherein the low-index element is between the scattering layer and the cover.

2. The organic light-emitting diode (OLED) device of claim 1, wherein the planar transparent film has a refractive index greater than or equal to the refractive index of the organic light-emitting layer and the planar transparent film is optically integrated with the organic layers.

3. The organic light-emitting diode (OLED) device of claim 1, wherein the one or more transparent openings through the planar light-reflecting layer and planar light-absorbing patterned layer include physical holes in the planar transparent film.

4. The organic light-emitting diode (OLED) device of claim 1, further comprising portions of the planar transparent film having no reflective area.

5. The organic light-emitting diode (OLED) device of claim 4, further comprising discrete light-emitting areas and wherein the portions of the planar transparent film having an absorbing area but no reflective area are located between the light-emitting areas.

6. The organic light-emitting diode (OLED) device of claim 1, wherein the contrast enhancement element is adjacent to the transparent electrode or a protective layer formed on the transparent electrode.

7. The organic light-emitting diode (OLED) device of claim 1, wherein the first or second electrode is patterned to form multiple light-emitting areas each having first and second distances in at least two dimensions and wherein the one or more transparent openings in the contrast enhancement element are spaced apart by a distance equal to or smaller than the distance in each dimension.

8. The organic light-emitting diode (OLED) device of claim 1, wherein the first or second electrode is patterned to form multiple light-emitting areas and wherein the one or more transparent openings in the contrast enhancement element are located over each light-emitting area.

9. The organic light-emitting diode (OLED) device of claim 1, wherein the first and second electrodes form one or more light-emitting areas and wherein the one or more transparent openings in the contrast enhancement element are located over each light-emitting area.

* * * * *